United States Patent [19]

Ono et al.

[11] Patent Number: 4,476,195

[45] Date of Patent: Oct. 9, 1984

[54] MAGNETIC RECORDING MEDIUM AND PROCESS FOR THE PRODUCTION THEREOF

[75] Inventors: Yoshihiro Ono; Akira Nabara; Tomoaki Ikeda, all of Saitama, Japan

[73] Assignee: Fuji Photo Film Co., Ltd., Kanagawa, Japan

[21] Appl. No.: 165,440

[22] Filed: Jul. 2, 1980

[30] Foreign Application Priority Data

Jul. 2, 1979 [JP] Japan .................................. 54-82708

[51] Int. Cl.³ .............................................. H01F 10/02
[52] U.S. Cl. .................................. 428/695; 427/132; 428/457; 428/900
[58] Field of Search ............................... 427/127–132, 427/48; 428/900; 204/192 M

[56] References Cited

U.S. PATENT DOCUMENTS 4,197,347 4/1980 Ogawa et al. ........................ 427/128
4,260,466 4/1981 Shirahata et al. .............. 204/192 M

FOREIGN PATENT DOCUMENTS 2511047 9/1975 Fed. Rep. of Germany.

*Primary Examiner*—Bernard D. Pianalto
*Attorney, Agent, or Firm*—Sughrue, Mion, Zinn, Macpeak and Seas

[57] ABSTRACT

A magnetic recording medium having, on a non-magnetic support, a magnetic recording layer of a mixture of a ferromagnetic material and an organic lubricant, which magnetic recording layer is prepared by the simultaneous vacuum evaporation process to result in improvements upon the surface strength and slip characteristics.

6 Claims, No Drawings

MAGNETIC RECORDING MEDIUM AND PROCESS FOR THE PRODUCTION THEREOF

BACKGROUND OF THE INVENTION

1. Field of the Invention

The present invention relates to a magnetic recording medium and a process for the production thereof. More particularly, it is concerned with a magnetic recording medium of the kind which has a thin solid film prepared by the vacuum evaporation of a ferromagnetic material, which film has improved surface strength and slip characteristics.

2. Description of the Prior Art

As for magnetic recording media, those media which are produced by a coating process, in which fine powders of magnetic materials, such as $\gamma\text{-Fe}_2\text{O}_3$, $\gamma\text{-Fe}_2\text{O}_3$ doped with Co, $\text{Fe}_3\text{O}_4$, $\text{CrO}_2$, ferromagnetic alloys, etc., are dispersed into organic binders, such as vinyl chloride-vinyl acetate copolymer, styrene-butadiene copolymer, epoxy resin, polyurethane resin, etc., the resulting dispersion are coated on non-magnetic supports and then dried, have been predominantly used. As there has been a growing demand for high density recording in recent years, much attention has been directed to thin solid films of ferromagnetic metals which are formed using a sputtering technique, a vacuum evaporation technique, an ion plating technique or the like, since these techniques have the capability of being used in producing the so-called binder-free magnetic recording medium. Various attempts have, therefore, been undertaken with the intent of using such films practically. However, these magnetic recording media, in which ferrormagnetic thin solid films are only formed on non-magnetic supports, suffer from the disadvantage that the magnetic layers thereof are peeled off or scratched through contact with a recording head during scanning, which differs from magnetic recording media produced by the coating process.

To remove the above-described disadvantage from such recording media, Japanese Patent Application (OPI) No. 12304/75 (the term "OPI" as used herein refers to a "published unexamined Japanese patent application") discloses a process wherein the surfaces of binder-free magnetic recording media are covered with macromolecular materials using a coating technique. In addition, Japanese Patent Application (OPI) No. 88704/78 describes a process wherein surface active agents having HLB values of 5 to 30 are provided on the surfaces of binder-free magnetic recording media by coating. In these wet processes, solvents must be used, a fear of environment pollution exists and further, an additional equipment to prevent explosions is required. Moreover, problems arise because oxidation of the surfaces of the ferromagnetic thin solid films due to contact with air occurs, which causes a deterioration thereof, and the number of pinholes made in the ferromagnetic thin solid films with the chance of friction are unavoidable when the ferromagnetic thin solid films are removed from the vacuum system at the conclusion of the evaporation and optionally, must be handled to coat macromolecular materials or surface active agents thereon. The magnetic recording media prepared by the above-described processes become valueless.

Furthermore, Japanese Patent Application (OPI) No. 28844/75 describes both a process in which a ferromagnetic material and a polymer are deposited at the same time using the vapor deposition technique and a process in which a ferromagnetic material and a monomer or an oligomer are deposited at the same time using the vapor deposition technique and subsequently, a polymerization reaction is carried out in the resulting deposited layer. Although these processes are excellent for producing high density recording media, they suffer a serious disadvantage that sufficiently high surface strength cannot be attained because of the insufficiency of the slip characteristics of the deposited layer.

SUMMARY OF THE INVENTION

Therefore, an object of the present invention is to provide a novel magnetic recording medium and a process for the production thereof, eliminating above-described defects.

More specifically, the present invention in one embodiment provides a magnetic recording medium characterized by a magnetic recording layer of a mixture of a ferromagnetic material and an organic lubricant which is provided on a non-magnetic support using the simultaneous vacuum evaporation process. The present invention in another embodiment provides a process for the production of a magnetic recording medium, which comprises simultaneously evaporating a ferromagnetic material and an organic lubricant onto a non-magnetic support in order to form a magnetic recording layer.

DETAILED DESCRIPTION OF THE INVENTION

The term "evaporation" as used in the present invention includes not only conventional vacuum evaporation using a resistance heater but also vacuum evaporation utilizing electron beam heating, a sputtering process, an ion plating process and the like.

The term "lubricant" as used herein refers to a compound possessing the function that on a thermal molding of plastic materials, the compound can increase the flowability of the plastic materials and can facilitate the release of the plastic moldings from molds, as defined in Japanese Industrial Standard JIS K6900. The term "organic lubricants" is used to describe all of organic compounds and organometallic compounds which fall under the category of the lubricants defined above and that exists as a solid having a vapor pressure of $5 \times 10^{-5}$ Torr or lower at room temperature (about 20°–30° C.). These compounds may form evaporation coated films whose composition differs from that before the evaporation.

Preferred examples of the above-described organic lubricants include paraffin series hydrocarbons, higher fatty acids, oxyfatty acids, fatty acid amides, fatty acid esters, fatty alcohols, metal soaps and the like.

Representative examples of paraffin series hydrocarbons are natural paraffin, microcrystalline wax and the like. Representative examples of higher fatty acids are lauric acid, myristic acid, palmitic acid, stearic acid, behenic acid, oleic acid, linolic acid, linolenic acid, arachidonic acid and the like. Examples of suitable oxyfatty acids are oxystearic acid, lanopalmitic acid and the like. Representative examples of fatty acid amides are lauric acid amide, myristic acid amide, palmitic acid amide, stearic acid amide, behenic acid amide, oleic acid amide, linolic acid amide, methylenebisstearamide, ethylenebisstearamide, hardened beef tallow amide and the like. Exemplary fatty acid esters are methyl stearate, cetyl palmitate, stearic acid monoglyceride and the like. Representative examples of fatty alcohols are cetyl alcohol, stearyl alcohol and the like. Representative metal soaps include those which are obtained from fatty acids having 12 to 30 carbon atoms and various metals, that is to say, those which correspond to the salts of fatty acids, such as lauric acid, myristic acid, palmitic acid, stearic acid, behenic acid, oleic acid, linolic acid, linolenic acid, arachidonic acid and so on, and metals such as zinc, copper, magnesium, nickel, iron, aluminum, lead, chromium, calcium, sodium, potassium, strontium and so on.

The term "simultaneous evaporation" as used in the present invention refers to the process in which materials to be evaporated are placed in separate evaporation sources and are simultaneously evaporated onto the same support, with their respective evaporation condition being controlled independently. This is a known technique in the evaporation correlated arts. In addition, the expression "simultaneous evaporation mixture layer" as used in the description of the present invention is intended to mean the evaporation layer produced by the above-described simultaneous evaporation process.

The simultaneous evaporation mixture layer is illustrated in greater detail below: In case of the simultaneous, dual evaporation (i.e., the simultaneous evaporation of two kinds of materials), the two kinds of materials may be mixed in the evaporation coated film in such a state that they are mixed homogeneously at the molecular level or one material may be dispersed into the other material. Suitable mixing ratios of the organic lubricant to the ferromagnetic material which can be used in the above-described simultaneous evaporation mixture layer desirably are as small a value as is possible within the range of the mixing ratio where the surface strength of the mixture layer is sufficiently high and the slip characteristics thereof are also satisfactory. The mixing ratio of the organic lubricant to the ferromagnetic material (by volume) is usually 3.0:1 or less, preferably 0.5:1 or less and more particularly, 0.1:1 or less.

Specific examples of ferromagnetic materials which can be employed for forming evaporation thin solid films in the present invention include ferromagnetic metals such as Fe, Co, Ni and the like; magnetic alloys such as Fe-Co, Fe-Ni, Co-Ni, Fe-Rh, Fe-Cu, Fe-Au, Co-Cu, Co-Au, Co-Y, Co-La, Co-Pr, Co-Gd, Co-Ga, Co-Sn, Co-Pt, Ni-Cu, Fe-Si, Fe-Co-Ni, Mn-Bi, Mn-Sb, Mn-Al and the like; magnetic oxides such as $\gamma$-$Fe_2O_3$, $Fe_3O_4$, $CrO_2$ and the like; magnetic nitrides such as $Fe_3N$ and the like; and ferrite series magnetic materials such as barium ferrite, strontium ferrite and the like.

The thin solid films of the above-described ferromagnetic materials are produced using a vacuum evaporation process, an ion plating process, a sputtering process, a reactive evaporation process or the like.

Moreover, the above-described ferromagnetic thin solid films can have, in the present invention, structures such that they are the layers of mixtures of ferromagnetic materials with non-magnetic materials, they are multilayer films constructed of ferromagnetic thin films and non-magnetic material layers provided thereon, or they have, between non-magnetic supports and the ferromagnetic layers, layers of non-magnetic materials differing from those which the supports are made.

Specific examples of non-magnetic supports which can be used in the present invention include supports of non-magnetic materials such as polyethylene terephthalate, polyimide, polyvinyl chloride, cellulose triacetate, polycarbonate, polyethylene naphthalate, glass, ceramics and so on; and the supports of metals such as aluminum, stainless steel, brass and so on. In addition, those supports obtained by forming metallic layers on the above-described supports using an evaporation process or a metal plating process, and those supports obtained by coating adhesives on the above-described base plates may be also employed as the supports for the ferromagnetic thin films of the present invention. These supports may be used in any forms, for example, tapes, sheets, cards, disks, drums and so on.

In accordance with embodiments of the present invention, magnetic recording media suitable for high density recording are provided without the necessity for complicated production steps, which include, for example, preparing magnetic materials, preparing coating solutions, coating them and so on, unaccompanied by problems that it is necessary to recover the solvents used or to take some precautions to prevent environmental pollution from the solvents used, because no solvents are used in the present invention, and that, without requiring any additional equipments for prevention of explosion. In addition, according to embodiments of the present invention, magnetic recording media which have excellent recording and playing back characteristics can be provided, because the production of a magnetic recording medium can be carried out inside a vacuum line during all production steps to result in prevention of undesirable phenomena, such as deterioration of a ferromagnetic material resulting from air oxidation, generation of pinholes caused by scratches, delamination of the recording layer, adhesion of dust or other foreign substances and so on, from occurring and a consequent marked reduction of the dropout phenomenon. Therefore, the magnetic recording media of the present invention have great value from an industrial point of view.

The present invention is illustrated in greater detail by reference to the following example. However, the invention is not intended to be construed as being limited to this example. Unless otherwise indicated, all parts, percents, ratios and the like are by weight.

EXAMPLE

A support of a polyethylene terephthalate film 25$\mu$ thick was arranged in a vacuum apparatus for evaporation so as to incline at the same angles of 60° to the evaporation source of cobalt and the evaporation source of stearic acid amide, respectively. The pressure inside the vacuum apparatus was reduced to $1 \times 10^{-5}$ Torr, and cobalt metal was evaporated onto the support with an evaporation rate of 2 Å/sec using the electron beam heating technique and simultaneously with the cobalt evaporation, stearic acid amide also was evaporated onto the same support with an evaporation rate of 0.5 Å/sec using the electric resistance heating technique. The final thickness of cobalt and that of stearic acid amide were 2,000 Å and 500 Å respectively. The ratio of the former thickness to the latter thickness corresponds to the ratio of the volume which cobalt occupies in the simultaneous evaporation mixture film to that which stearic acid amide occupies therein.

The evaporation film thickness of cobalt and that of stearic acid amide were measured independently using two separate quartz oscillator type film thickness monitors, Model DTM-200 produced by Sloan Instruments Corp. (U.S.) so that one of the measurements did not interfere with the other one. The thus-obtained simultaneous evaporation mixture layer exhibited a reflectance of visible light lower than that of the evaporation film of cobalt alone, and had a reddish tinge. The surface strength of this simultaneous evaporation film was measured with a "HEIDON-18" resistance tester produced by Shinto Kagaku K. K. using an R ball stylus (R=0.1 mm). The least load with which the surface of a film could be scratched was taken as an indication of the film surface strength. The simultaneous evaporation film could be scratched with a load of 60 g, while the evaporation film of cobalt alone could be scratched with a load of 30 g. Accordingly, a surface strength higher than that of single evaporation film by a factor of 2 was attained by the simultaneous evaporation film of this invention. The magnetic characteristics of the simultaneous evaporation film were somewhat inferior to those of the evaporation film of cobalt alone, but they were sufficiently good from the standpoint of practical use and further, power loss due to the simultaneous evaporation did not occur.

While the invention has been described in detail and with reference to specific embodiments thereof, it will be apparent to one skilled in the art that various changes and modifications can be made therein without departing from the spirit and scope thereof.

What is claimed is:

1. A magnetic recording medium comprising a non-magnetic support having thereon a magnetic recording layer comprising a layer of a simultaneously evaporated mixture consisting essentially of a ferromagnetic material and an organic lubricant, said organic lubricant being selected from the group consisting of a paraffin wax, a higher fatty acid, an oxy fatty acid, a fatty acid amide, a fatty acid ester, a fatty alcohol, a metal soap and a mixture thereof.

2. The magnetic recording medium of claim 1, wherein said organic lubricant is a solid having a vapor pressure of $5 \times 10^{-5}$ Torr or lower at room temperature.

3. The magnetic recording medium of claim 1, wherein the volume ratio of the organic lubricant to the ferromagnetic material is 3.0:1 or less.

4. A process for producing a magnetic recording medium, comprising a non-magnetic support having thereon a magnetic recording layer comprising a layer of a simultaneously evaporated mixture consisting essentially of a ferromagnetic material and an organic lubricant, said organic lubricant being selected from the group consisting of a paraffin wax, a higher fatty acid, an oxy fatty acid, a fatty acid amide, a fatty acid ester, a fatty alcohol, a metal soap and a mixture thereof, which comprises simultaneously evaporating both said ferromagnetic material and said organic lubricant onto a non-magnetic support to form a magnetic recording layer thereon.

5. The process of claim 4, wherein said organic lubricant is a solid having a vapor pressure of $5 \times 10^{-5}$ Torr or lower at room temperature.

6. The process of claim 4, wherein the volume ratio of the organic lubricant to the ferromagnetic material is 3.0:1 or less.

* * * * *